United States Patent
Han

(10) Patent No.: US 9,099,338 B2
(45) Date of Patent: Aug. 4, 2015

(54) METHOD OF FORMING HIGH K METAL GATE

(71) Applicant: Semiconductor Manufacturing International (Shanghai) Corporation, Shanghai (CN)

(72) Inventor: Qiuhua Han, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/305,969

(22) Filed: Jun. 16, 2014

(65) Prior Publication Data

US 2015/0069518 A1    Mar. 12, 2015

(30) Foreign Application Priority Data

Sep. 10, 2013    (CN) .......................... 2013 1 0410801

(51) Int. Cl.
  *H01L 21/8238*    (2006.01)
  *H01L 27/092*    (2006.01)

(52) U.S. Cl.
  CPC ...... *H01L 27/092* (2013.01); *H01L 21/823828* (2013.01)

(58) Field of Classification Search
  USPC .......................................... 257/369; 438/199
  See application file for complete search history.

(56) References Cited

U.S. PATENT DOCUMENTS

| | | | | |
|---|---|---|---|---|
| 6,682,966 B2* | 1/2004 | Iwata et al. | ................... | 438/207 |
| 6,750,519 B2* | 6/2004 | Lin et al. | ........................ | 257/407 |
| 8,338,242 B2* | 12/2012 | Hsu et al. | ...................... | 438/183 |
| 2008/0079084 A1* | 4/2008 | Hanafi | ........................ | 257/369 |
| 2009/0315079 A1* | 12/2009 | Tien et al. | ...................... | 257/207 |
| 2010/0052071 A1* | 3/2010 | Niimi et al. | ..................... | 257/369 |
| 2011/0062524 A1* | 3/2011 | Lin et al. | ........................ | 257/369 |
| 2012/0056267 A1* | 3/2012 | Yin et al. | ........................ | 257/369 |
| 2013/0087856 A1* | 4/2013 | Ortolland et al. | ............. | 257/365 |
| 2013/0214363 A1* | 8/2013 | Nemouchi et al. | ............ | 257/369 |
| 2013/0249014 A1* | 9/2013 | Kito | ................ | 257/369 |
| 2014/0015064 A1* | 1/2014 | Bu et al. | ........................ | 257/369 |

\* cited by examiner

*Primary Examiner* — Thao P Le

(74) *Attorney, Agent, or Firm* — Kilpatrick Townsend and Stockton LLP

(57) ABSTRACT

A semiconductor device and method of forming the same includes a substrate having a NMOS region and a PMOS region. The method includes forming a dummy gate structure having a stacked sacrificial dielectric layer and a sacrificial gate material layer on the NMOS and PMOS regions. The method further includes concurrently removing the stacked sacrificial dielectric layer and a sacrificial gate material layer to form a groove, and forming a high-K dielectric layer and a first metal gate layer in the grove. The method also includes forming a hard mask over the NMOS region, removing the first metal gate layer and the high-K dielectric layer in the PMOS region to form a channel groove, forming a second high-K dielectric layer and a second metal gate layer in the channel grove, and removing the hard mask. The work function metal layer in the NMOS and PMOS regions can be independently controlled.

16 Claims, 8 Drawing Sheets

METHOD OF FORMING HIGH K METAL GATE

CROSS-REFERENCES TO RELATED APPLICATIONS

The present application claims priority to Chinese patent application No. 201310410801.0, entitled "A METHOD OF FORMING HIGH K METAL GATE", filed with the State Intellectual Property Office of People's Republic of China on Sep. 10, 2013, the content of which is incorporated herein by reference in its entirety.

FIELD OF THE INVENTION

The present invention relates to semiconductor device manufacturing, and more particularly to a high-K metal gate CMOS device, and method of forming the same.

BACKGROUND OF THE INVENTION

In the next generation of integrated circuit manufacturing processes, gate electrodes of a complementary metal oxide semiconductor (CMOS) device generally use high-k metal gate technology. Generally speaking, for advanced CMOS technology nodes, there are two different processes for forming high-K metal gate. One process is to firstly form a high-K dielectric layer followed by a metal gate, and another process is after the high-K dielectric layer followed by the metal gate. The first process includes forming a dummy gate structure on a semiconductor substrate. The dummy gate structure includes from bottom to top a bottom-interface layer, a high-K dielectric layer overlying the bottom interface layer, a capping layer over the high-K dielectric layer, and a sacrificial layer over the capping layer. The first process also includes forming sidewall structures on opposite sides of the dummy gate structure, removing the sacrificial layer to form a groove between the sidewall structures, and sequentially depositing in the groove a work function metal layer, a barrier layer and a wetting layer. The first process further includes filling the groove with a metal material (generally aluminum). The second process includes forming a dummy gate structure on a semiconductor substrate. The dummy gate structure includes from bottom to top a sacrificial dielectric layer and a sacrificial gate layer. The second process also includes forming sidewall structures on opposite sides of the dummy gate structure, removing the sacrificial layer to form a trench between the sidewall structures, and sequentially depositing in the trench an interface layer, a high-K dielectric layer, a capping layer, a work function metal layer, a barrier layer, a wetting layer, and filling the groove with a metal material (which is generally aluminum).

There are generally two ways of removing the sacrificial gate layer in the high-K metal gate process. The first way includes concurrently removing the sacrificial layer of the dummy gate structure in the NMOS and PMOS regions. For example, as shown in FIG. 1A, an isolation structure 101 separates a semiconductor substrate 100 into a NMOS region and a PMOS region. A dummy gate structure 102 is separately formed on the NMOS and PMOS regions. Dummy gate structure 102 includes from bottom to top a high-K dielectric layer 102a and a sacrificial gate layer 102b. Sidewall structures 103 are formed on opposite sides of dummy gate structures 102. A contact hole etch stop layer 104 and an interlayer dielectric layer 2105 are sequentially formed on semiconductor substrate 100. A chemical mechanical polishing (CMP) process is performed to expose a top surface of dummy gate structure 102. Thereafter, as shown in FIG. 1B, sacrificial gate layer 102b in the NMOS and PMOS regions is concurrently removed. A suitable work function metal layer 106 is deposited on the PMOS region covering interlayer dielectric layer 105, sidewall structures 103, and high-K dielectric layer 102a. Thereafter, as shown in FIG. 1C, a portion of work function metal layer 106 is removed by etching from the NMOS region, and a suitable work function metal layer 107 is deposited covering interlayer dielectric layer 105, sidewall structures 103 and high-K dielectric layer 102a of the NMOS region and work function metal layer 106 of the PMOS region. Thereafter, as shown in FIG. 1D, a metal barrier layer 108 and a metal gate material layer 109 are sequentially deposited to cover work function metal layer 107. A chemical mechanical polishing is performed to expose interlayer dielectric layer 105 to complete the formation of the high-K metal gate. This approach is disadvantageous due to the suitable work function metal layer 107 of the NMOS region is also formed in the high-K metal gate of the PMOS region, therefore, the work function metal layer of the high-K metal gate disposed in the NMOS and PMOS regions cannot be individually adjusted.

A second approach is to individually remove the sacrificial layer in the dummy gate structures of the NMOS and PMOS regions. For example, as shown in FIG. 2A, an isolation structure 201 separates a semiconductor substrate 200 into a NMOS region and a PMOS region. Dummy gate structure 202 is formed in the NMOS and PMOS regions. Dummy gate structure 202 includes from bottom to top a high-K dielectric layer 202a and a sacrificial layer 202b. Sidewall structures 203 are formed on opposite sides of dummy gate structure 202. Contact hole etch stop layer 204 and an interlayer dielectric layer 205 are sequentially formed, and a chemical mechanical polishing is then performed to expose a top surface of dummy gate structure 202. Thereafter, as shown in FIG. 2B, a patterned photoresist layer 206 is formed covering the NMOS region, sacrificial layer 202b of dummy gate structure in the PMOS region is removed by etching using the patterned photoresist layer 206 as a mask. Thereafter, as shown in FIG. 2C, the patterned photoresist layer 206 is removed, a work function metal layer 207a, a barrier layer 207b, and a metal gate layer 207c are sequentially deposited. A CMP is performed to expose interlayer dielectric layer 205 to complete the formation of a high-K metal gate 207. Thereafter, as shown in FIG. 2D, a second patterned photoresist layer is formed covering the PMOS region, and using the second patterned photoresist layer as a mask to remove the sacrificial layer 202b of dummy gate structure 202 in the NMOS region. Thereafter, the second patterned photoresist layer is removed, a work function metal layer 208a, a barrier layer 208b, and a metal gate layer 208c are sequentially deposited. A CMP is performed to expose interlayer dielectric layer 205 to complete the formation of a high-K metal gate 208. This approach is disadvantageous due to the fact that two patterned photoresist layers are needed to separately cover the NMOS and PMOS regions, thereby increasing the production costs. Furthermore, etch residues generated by two etchings may greatly affect the subsequent depositions of the work function metal layer, the barrier layer, and the metal gate layer.

Thus, the need exists for solutions to the problems with the prior art.

BRIEF SUMMARY OF THE INVENTION

Embodiments of the present invention provide a method of forming a semiconductor device. The method includes providing a semiconductor substrate having a NMOS region and a PMOS region, forming dummy gate structures having a stacked sacrificial gate material layer over a sacrificial dielectric layer in the NMOS region and in the PMOS region, and concurrently removing the sacrificial gate material layer and the sacrificial dielectric layer of the dummy gate structures to form a groove in the dummy gate structure in the NMOS region and a groove in the dummy gate structure in the PMOS region. The method further includes forming a first high-K dielectric layer in the grooves of the NMOS and PMOS regions and a first metal gate over the first high-K dielectric layer, forming a hard mask over the NMOS region, and removing the first metal gate and the first high-K dielectric layer in the dummy gate structure in the PMOS region using the hard mask as a mask to form a channel groove in the semiconductor substrate. The method also includes forming a second high-K dielectric layer in the channel groove, forming a second metal gate layer over the second high-K dielectric layer, and removing the hard mask.

In an embodiment, the sacrificial dielectric layer and the sacrificial gate material layer of the dummy gate structure are removed by a first dry-etching process.

In an embodiment, the first dry-etching process is characterized by a HBr etching gas at a flow rate ranging from 20 sccm to 500 sccm, a pressure ranging from 2 to 40 mTorr, and a power ranging from 100 to 2000 W.

In an embodiment, the method further comprises a wet etching process to remove residues and impurities generated by the first dry-etching process.

In an embodiment, the first metal gate and the first high-K dielectric layer in the dummy gate structure in the PMOS region are removed by a second dry-etching process to form the channel groove.

In an embodiment, the second dry-etching process is characterized by a mixture gas of $Cl_2$ and $O_2$ as an etching gas, a flow rate of the Cl2 gas is in a range between 50 sccm and 500 sccm, a flow rate of the 02 gas is in a range between 2 sccm and 10 sccm, a pressure in a range between 2 and 40 mTorr, a power in a range between 200 and 2000 W.

In an embodiment, the first metal gate and the first high-K dielectric layer in the dummy gate structure in the PMOS are removed by a combined directional dry etching and anisotropic wet etching.

In an embodiment, the channel groove has a depth of about 1 to 4 nm.

In an embodiment, the method further comprises, before removing the sacrificial dielectric layer and the sacrificial gate material layer, forming sidewall structures on opposite sides of the dummy gate structures, forming source/drain regions adjacent to the sidewall structures, forming silicon germanium layers at both sides of the sidewall structures in the PMOS region of the semiconductor substrate, forming a contact hole etch stop layer, and forming an interlayer dielectric layer completely covering the contact hole etch layer and the dummy gate structure. The method also includes performing a chemical mechanical polishing process to expose a top surface of the dummy gate structures.

In an embodiment, the method further includes, after forming the first and second metal gates, performing a chemical mechanical polishing process to expose a top surface of the interlayer dielectric layer.

In an embodiment, the chemical mechanical polishing process also removes the hard mask.

In an embodiment, the first metal gate includes a first work function metal layer, a first barrier layer, and a first metal gate material layer formed from bottom to top, respectively. The second metal gate includes a second work function metal layer, a second barrier layer, and a second metal gate material layer formed from bottom to top, respectively.

In an embodiment, the first work function metal layer may include one or more metals or metal compounds having a suitable metal material for a NMOS device, and the second work function metal layer may include one or more metals or metal compounds having a suitable metal material for a PMOS device.

In an embodiment, the method further includes a capping layer disposed between the first high-K dielectric layer and the first work function metal layer and between the second high-K dielectric layer and the second work function metal layer. The capping layer may include titanium nitride or tantalum nitride.

In an embodiment, the method also includes forming an interface layer between the first high-K dielectric layer and the semiconductor substrate and between the second high-K dielectric layer and the semiconductor substrate. The interface layer includes silicon oxide.

In an embodiment, the first and second high-K dielectric layers each have a dielectric constant greater than 3.9. The sacrificial gate material layer includes polysilicon, silicon nitride, or amorphous carbon. The sacrificial dielectric layer includes silicon dioxide. The hard mask includes SiN or BN.

Embodiments of the present invention also provide a semiconductor device. The semiconductor device includes a semiconductor substrate having a NMOS region and a PMOS region, an isolation structure disposed between the NMOS region and the PMOS region, a first metal gate in the NMOS region, and a second metal gate in the PMOS region. The first metal gate has a bottom portion disposed on the semiconductor substrate, and the second metal gate has a bottom portion disposed in the semiconductor substrate. The semiconductor device also includes sidewall structures disposed on opposite sides of the first and second metal gates, and silicon germanium layers disposed in the semiconductor substrate and adjacent to the sidewall structures of the second metal gate in the PMOS region.

In an embodiment, the semiconductor device further includes a high-K dielectric layer disposed between the first metal gate and the semiconductor substrate and between the second metal gate and the semiconductor substrate.

In an embodiment, the isolation structure is a shallow trench isolation structure.

According to embodiments of the present invention, the work function of the first work function metal gate and the second work function metal gate can be individually adjusted. By eliminating a photolithographic mask process step, the production cost is reduced, and the stress applied to the silicon germanium in the PMOS region of the semiconductor substrate is enhanced.

The following detailed description together with the accompanying drawings will provide a better understanding of the nature and advantages of the present invention.

DETAILED DESCRIPTION OF THE INVENTION

Figure 1A:
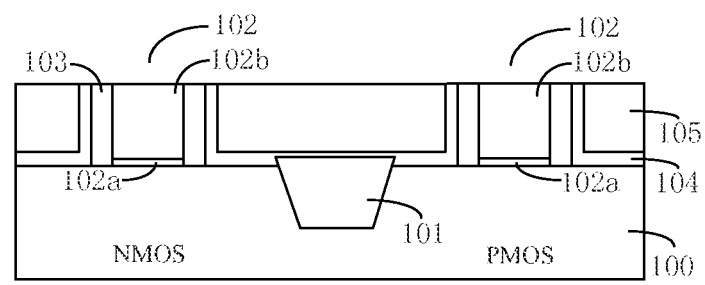
FIGS. 1A through 1D are cross-sectional views of sequential steps of one conventional method for forming a high-K metal gate device.
Figure 1B:
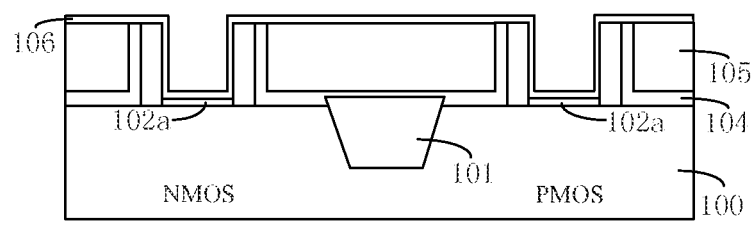
Figure 1C:
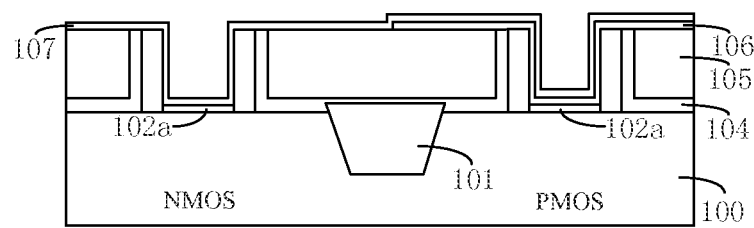
Figure 1D:
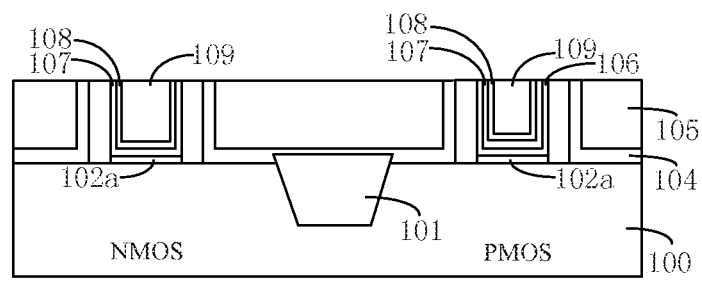
Figure 2A:
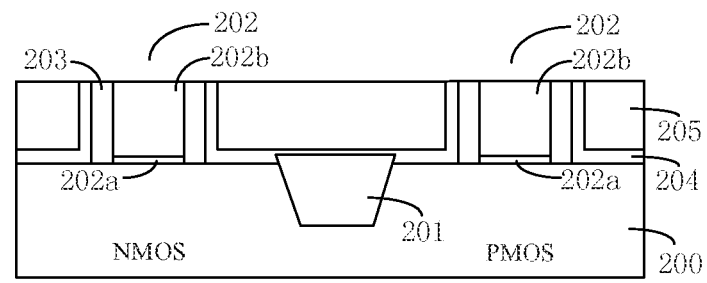
FIGS. 2A through 2D are cross-sectional views of sequential steps of another conventional method for forming a high-K metal gate device.
Figure 2B:
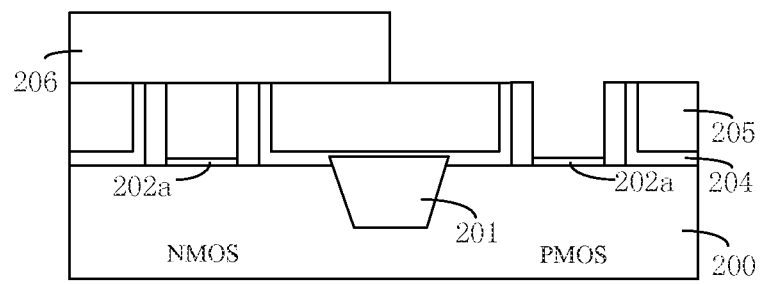
Figure 2C:
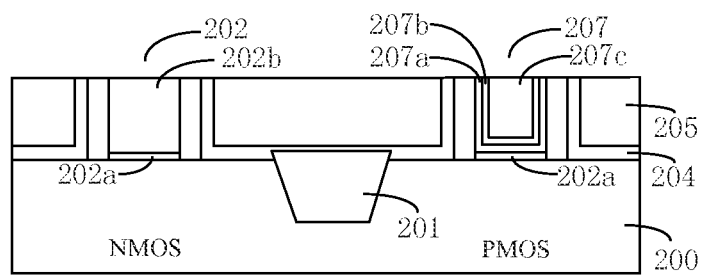
Figure 2D:
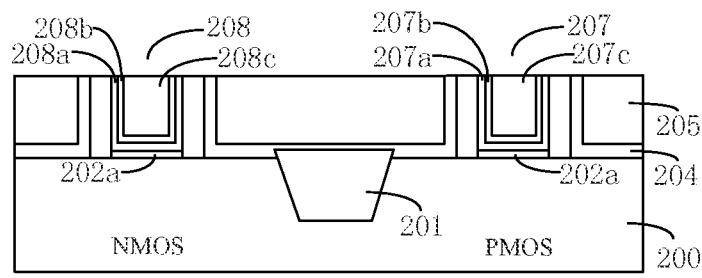

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

Hereinafter, preferred embodiments of the present disclosure will be described in detail with reference to the accompanying drawings. The description proposed herein is just a preferable example for the purpose of illustration only, not intended to limit the scope of the disclosure, so it would be understood that other equivalents and modifications could be made thereto without departing from the spirit and scope of the disclosure.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Referring to FIGS. 3A-3E and 4, a method of forming a high-K metal gate is described. FIGS. 3A-3E are cross-sectional views of intermediate stages of a high-K metal gate semiconductor device according to an embodiment of the present invention.

Figure 3A:
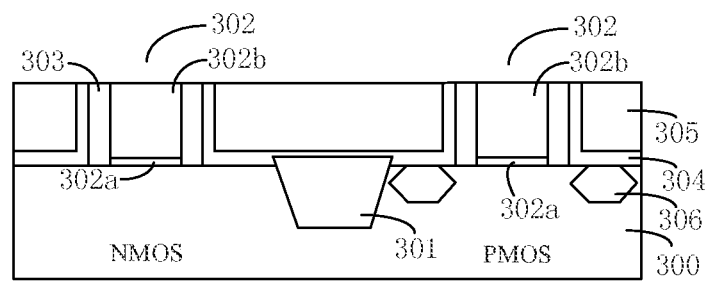
FIGS. 3A through 3E are cross-sectional views of sequential steps of a method for forming a high-K metal gate device according to an embodiment of the present invention.

Referring to FIG. 3A, the method may include provide a semiconductor substrate 300. Semiconductor substrate 300 may include undoped silicon, silicon doped with impurities, silicon on insulator (SOI), silicon-on-insulator laminate (SSOI), laminated silicon-germanium-on-insulator (S—SiGeOI), silicon germanium-on-insulator (SiGeOI) and germanium-on-insulator (GeOI), etc. In an exemplary embodiment, semiconductor substrate 300 includes monocrystalline silicon. An isolation structure 301 is formed in semiconductor substrate 300. In an exemplary embodiment, isolation structure 301 is a shallow trench isolation (STI) structure or a local oxidation of silicon (LOCOS) isolation structure. Isolation structure 301 separates semiconductor substrate into a NMOS region and a PMOS region. The method also includes forming well structures within semiconductor substrate 300. The well structures are not shown for reasons of clarity.

The method further includes forming a dummy gate structure 302 in the NMOS region and a dummy gate structure 302 in the PMOS region. In an exemplary embodiment, dummy gate structure 302 includes a sacrificial dielectric layer 302*a* and a sacrificial gate material layer 302*b* stacked from bottom to top, respectively. Sacrificial dielectric layer 302*a* may be made of a silicon dioxide. Sacrificial gate material layer 302*b* may be made of polysilicon, silicon nitride, or amorphous carbon layer. In a specific embodiment, sacrificial gate material layer 302*b* includes polysilicon.

In an embodiment, sidewall structures 303 may be disposed on opposite sides of dummy gate structure 302. Sidewall structures 303 include at least an oxide layer and/or a nitride layer. The method further includes forming source/drain regions in semiconductor substrate 300 on both sides of sidewall structures 303. The source/drain regions are not shown for clarity reasons.

The method further includes forming a silicon germanium layer 306 in semiconductor substrate 300 adjacent to sidewall structures 303 in the PMOS region. Forming the silicon germanium layer may include forming a Σ-shaped groove in both sides of sidewall structures 303 in the PMOS region using first a dry etching followed by a wet etching, selectively growing an epitaxial silicon germanium layer to completely fill the Σ-shaped groove. The embedded silicon germanium layer 306 may be doped with boron. The epitaxial growth may be performed with one of a low pressure chemical vapor deposition (LPCVD), plasma enhanced chemical vapor deposition (PECVD), ultra high vacuum chemical vapor deposition (UHVCVD), rapid thermal chemical vapor deposition (RTCVD), and molecular beam epitaxy (MBE). The dry etching followed by a wet etching process may include forming a groove along the sidewall structures 303 in the PMOS region using a dry etching process, the dry etching process may use $CF_4$ and HBr as a main etching gas at a temperature ranging from 40 to 60° C., a power ranging from 200 to 400 W, and with a bias voltage ranging from 50 and 200 V, the etching duration depends from the groove depth. The dry etching continues in the groove with an isotropic etch process to form an elliptical bottom, i.e., a bowl-form groove. In an embodiment, the epitaxial dry etching process may use $Cl_2$ and $NF_3$ as a main etching gas, at a temperature ranging from 40 to 60° C., a power ranging from 100 to 500 W, and with a bias voltage ranging from 0 to 200 V, the etching duration depends from the groove lateral width. Then a wet etching process is performed to extend the bowl-shaped groove to the Σ-shaped form. The wet etching process may be performed at a temperature ranging from 30 to 60° C., and the etching duration depends from the target dimension of the Σ-shaped groove and may be in a range between 100 seconds and 300 seconds. In an embodiment, the wet etching uses tetramethylammonium hydroxide (TMAH) as an etching solution.

In an embodiment, the method may include forming a capping layer on the top surface of silicon germanium layer 306 to facilitate the subsequent formation of a self-aligned silicide over the silicon germanium layer 306. The capping layer is formed in-situ in the same reaction chamber as the epitaxially grown silicon germanium layer 306. The capping layer is a silicon. The capping layer is not shown for clarity reasons.

After the epitaxially growth of the silicon germanium layer 306 and/or the formation of the capping layer thereon, the method further includes a contact etch stop layer 304 and an interlayer dielectric layer 305 that entirely covers the dummy gate structures 302. Contact etch stop layer 304 is preferably a silicon nitride, and interlayer dielectric layer 305 is an oxide preferably formed using a plasma enhanced chemical vapor deposition process. Thereafter, a chemical mechanical polishing process is performed to expose a top surface of dummy gate structures 302.

Figure 3B:
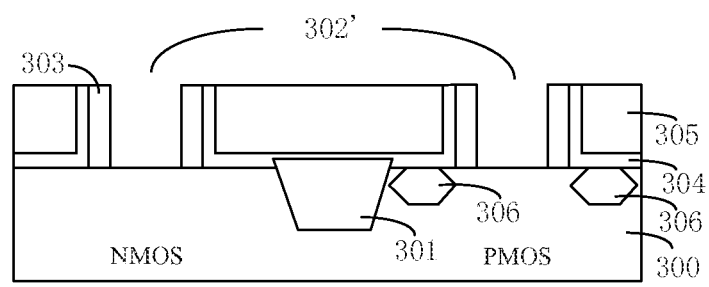

Thereafter, as shown in FIG. 3B, sacrificial dielectric layer 302a and sacrificial gate material layer 302b of dummy gate structure 302 in the NMOS and PMOS regions are concurrently removed to formed grooves 302'. In an embodiment, the sacrificial dielectric layer and the sacrificial gate material layer are removed by a dry etching process, which may include a HBr etching gas with a flow rate from 20 to 500 sccm (standard cubic centimeter per minute), at a pressure in the range from 2 to 40 mTorr, a power in the range from 100 to 2000 W. Thereafter, a wet etching process is performed to remove etch residues and impurities resulted from the dry etching.

Figure 3C:
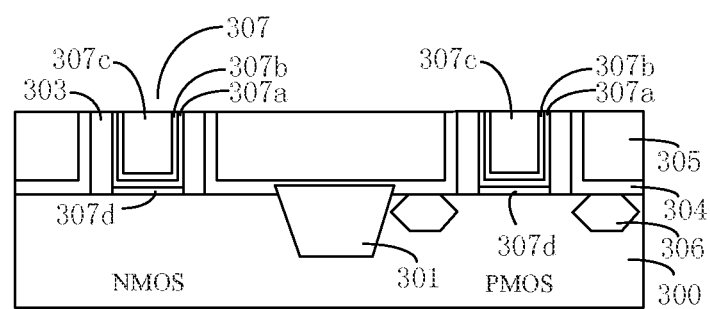

Thereafter, as shown in FIG. 3C, the method further include forming a high-K dielectric layer 307d and a first metal gate 307. High-K dielectric layer 307d has a dielectric constant greater than 3.9, and may be made of hafnium oxide, hafinum silicon oxide, silicon oxynitride, hafnium oxide, lanthanum oxide, zirconium oxide, zirconium silicon oxide, titanium oxide, tantalum oxide, barium strontium titanium oxide, barium titanium oxide, strontium titanium oxide, alumina, and the like. In a specific embodiment, high-K dielectric layer 307d is made of hafnium oxide, zirconium oxide, or aluminum oxide. In an embodiment, first metal gate 307 includes a first work function metal layer 307a, a barrier layer 307b, and a metal gate material layer 307c that are sequentially formed from bottom to top. First work function metal layer 307a may include one or more layers of metal or metal compounds, the metal and metal compounds suitable for the NMOS region includes titanium, tantalum, aluminum, zirconium, hafnium, and alloys thereof, and carbides, nitrides of those elements. Barrier layer 307b may include tantalum nitride or titanium nitride. Metal gate material layer 307c may include tungsten or aluminum. It will be appreciated that there may be an interface layer disposed between the high-K dielectric layer 307d and semiconductor substrate 300, the interface layer material may be a silicon oxide ($SiO_x$). The interface layer is to improve the interface characteristics between high-K dielectric layer 307d and semiconductor substrate 300. The method may also include forming a capping layer between high-K dielectric layer 307d and first work function metal layer 307a, the capping layer may include titanium nitride or tantalum nitride to prevent the metal material in first work function metal layer 307a from diffusing to high-K dielectric layer 307d. In an embodiment, a wetting layer may be formed on the barrier layer 307c to improve the interface characteristics between barrier layer 307b and gate metal material layer 307c. The wetting layer may include titanium or titanium alloy. The wetting layer is not shown for reasons of clarity.

In an embodiment, high-K dielectric layer 307d is formed by chemical vapor deposition. First work function metal layer 307a and barrier layer 307b are formed by atomic layer deposition or by physical vapor deposition. Metal gate material layer 307c is formed by a chemical vapor deposition or a physical vapor deposition. Thereafter, a chemical mechanical polishing (CMP) process is performed on the above layers to expose interlayer dielectric layer 305. The CMP process stops when a surface of interlayer dielectric layer 305 is exposed.

Figure 3D:
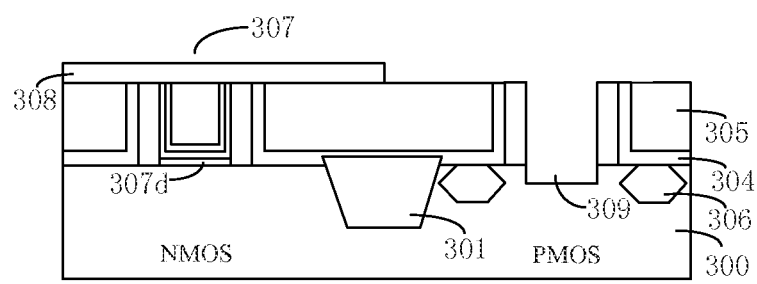

Thereafter, as shown in FIG. 3D, a hard mask 308 is formed over the NMOS region. The hard mask 308 may include SiN, BN, and the like. The process of forming a hard mask is well known to those skilled in the art, and will not be described in detail herein, in order to not obscure the principles of the present invention.

Thereafter, as shown in FIG. 3D, using hard mask 308 as a mask, the method includes removing first metal gate 307 and high-K dielectric layer 307d and forming a groove 309 in semiconductor substrate 309. In an exemplary embodiment, groove 309 has a depth in a range between 1 and 4 mm. Forming the groove 309 includes etching with a $Cl_2$ and $O_2$ etching gas, the $Cl_2$ flow rate is in a range between 50 sccm and 500 sccm, the $O_2$ flow rate is in a range between 2 sccm and 10 sccm, at a pressure in a range between 2 and 40 mTorr, and with a power in a range between 100 W and 2000 W. It is noted that the dry etching may be combined with a wet etching to enhance the removal efficiency of first metal gate 307 and high-K dielectric layer 307d and etch residues and impurities generated during etching.

Figure 3E:
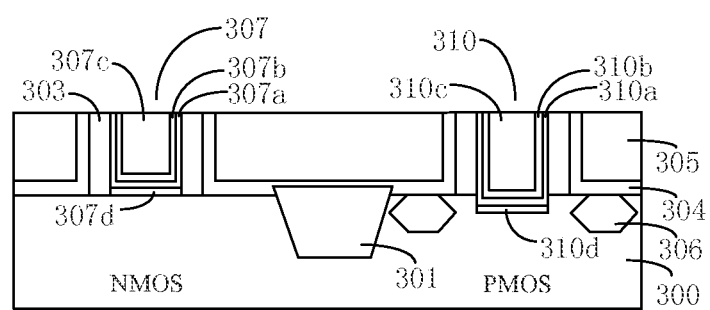

Thereafter, as shown in FIG. 3E, the method further includes forming a high-K dielectric layer 310d, a second metal gate 310 over high-K dielectric layer 310d, and removing hard mask 308. High-K dielectric layer 310d has a dielectric constant greater than 3.9 and may comprise hafnium oxide, hafnium silicon oxide, silicon oxynitride, hafnium oxide, lanthanum oxide, zirconium oxide, zirconium silicon oxide, titanium oxide, tantalum oxide, barium strontium titanium oxide, barium titanium oxide, strontium titanium oxide, aluminum oxide, etc. In a specific embodiment, high-K dielectric layer 310d may include hafnium oxide, zirconium oxide, or aluminum oxide. Second metal gate 310 may include a second work function metal layer 310a, a barrier layer 310b, and/or a metal gate layer 310c sequentially from bottom to top, respectively. Second work function metal layer 310a may include one or more layers of metal or metal compounds having a material suitable for a PMOS device. The materials may be selected from the group consisting of ruthenium, palladium, platinum, tungsten and alloys thereof, and other metal elements including carbides, nitrides and the like. Barrier layer 310b may include titanium nitride, tantalum nitride, and metal gate layer 310c may include tungsten or aluminum. It is noted that the method may include forming an interface layer between high-K dielectric layer 310d and semiconductor substrate 300, the interface layer may include silicon oxide ($SiO_x$). The interface layer is used to improve interface characteristics between high-K dielectric layer 310d and semiconductor substrate 300. The method may include forming a capping layer between high-K dielectric layer 310d and second work function metal layer 310a to prevent second work function metal layer 310a from diffusing into high-K dielectric layer 310d. The capping layer may include titanium nitride or tantalum nitride.

The method may further include a wetting layer disposed between barrier layer 310b and metal gate layer 310c to improve interface characteristics therebetween. The wetting layer may include titanium or titanium-aluminum alloy. The wetting layer is not shown for reasons of clarity. In an embodiment, high-K dielectric layer 310d is formed by chemical vapor deposition. Second work function metal layer 310a and barrier layer 310b each are formed by atomic layer deposition or physical vapor deposition. Metal gate layer 310c is formed by chemical vapor deposition or physical vapor deposition. Thereafter, a chemical mechanical polishing process is performed on the above described layers to expose a surface of interlayer dielectric layer 305. The hard mask layer 308 is also removed by the chemical mechanical polishing process.

This completes the steps of a method of forming a high-K metal gate according to an embodiment of the present invention. As shown in FIG. 3E, the lower portion of second metal gate 310 within semiconductor substrate 300 can significantly improve the stress of the embedded silicon germanium layer 306 applied to the channel region in the PMOS region. It is to be understood that, the process is for forming a high-K dielectric after the formation of a metal gate, those skilled in the art will appreciate that the process is equally applicable for a method of forming a high-K dielectric layer first followed by a metal gate layer.

Next, the method includes completing the front-end fabrication process, which may include forming a second interlayer dielectric layer over interlayer dielectric layer 305 to cover first metal gate 307 and second metal gate 310, forming first contact holes connecting a top surface of silicon germanium layer 306 in the PMOS region and second contact holes connecting source/drain regions in the NMOS region, forming a self-aligned silicide over the bottom surface of the second contact holes, and filling the contact holes with a metal material (generally tungsten) connecting the self-aligned silicide to form a contact plug.

Thereafter, a conventional backend process may be utilized to complete the semiconductor device. The backend process may include forming a multitude of metal interconnect layers, typically using dual damascene process, and forming metal pads for wire bonding.

Figure 4:
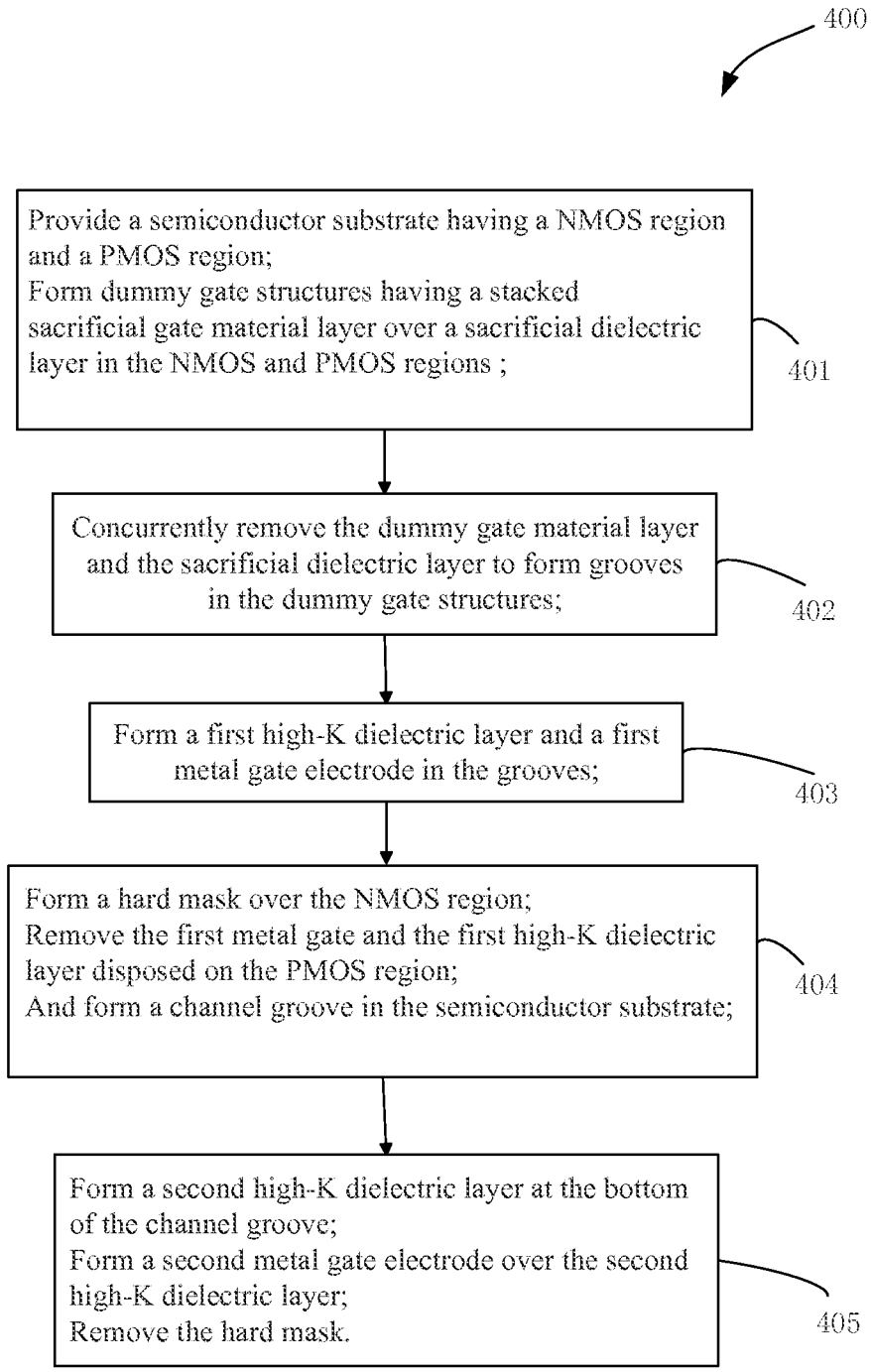
FIG. 4 is a flow chart of a method of fabricating a semiconductor device according to an embodiment of the present invention.

FIG. 4 is a simplified low chart of a method 400 for manufacturing a high-K metal gate according to an embodiment of the present invention. Method 400 includes:

At block 401: provide a semiconductor substrate having a NMOS region and a PMOS region, form a dummy gate structure including a stacked sacrificial dielectric layer and a sacrificial gate material layer disposed from bottom to top, respectively, in the NMOS region and in the PMOS region;

At block A2: concurrently remove the sacrificial dielectric layer and the sacrificial gate material layer of the dummy gate structure to form a groove;

At block A3: form a first high-K dielectric layer and a first metal gate electrode in the groove;

At block 404: form a hard mask over the NMOS region; remove the first metal gate and the high-K dielectric layer in the dummy gate structure in the PMOS region using the hard mask as a mask, and form a channel groove in the semiconductor substrate (as shown in FIG. 3D);

At block 405: form a second high-K dielectric layer at the bottom of the channel groove; form a second metal gate electrode over the second high-K dielectric layer; and remove the hard mask.

According to the present invention, the work function of work function metal layer 307a and work function metal layer 310a can be independently adjusted. Production costs can be reduced by reducing a photolithographic process of removing sacrificial gate material layer 302b and sacrificial dielectric layer 302a, and the stress applied to the silicon germanium layer 306 in the PMOS region can be significantly improved.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of forming a semiconductor device, the method comprising:
    providing a semiconductor substrate having a NMOS region and a PMOS region;
    forming dummy gate structures having a stacked sacrificial gate material layer over a sacrificial dielectric layer in the NMOS and PMOS regions;
    concurrently removing the sacrificial gate material layer and the sacrificial dielectric layer to form a groove in the dummy gate structure in the NMOS region and a groove in the dummy gate structure in the PMOS region;
    forming a first high-K dielectric layer in the grooves of the NMOS and PMOS regions and a first metal gate over the first high-K dielectric layer;
    forming a hard mask over the NMOS region;
    removing the first metal gate layer and the first high-K dielectric layer of the dummy gate structure in the PMOS region using the hard mask as a mask to form a channel groove in the semiconductor substrate;
    forming a second high-K dielectric layer in the channel groove;
    forming a second metal gate over the second high-K dielectric layer; and
    removing the hard mask.

2. The method of claim 1, wherein concurrently removing the sacrificial gate material layer and the sacrificial dielectric layer of the dummy gate structures comprises a dry-etching process.

3. The method of claim 2, wherein the dry-etching process is characterized by a HBr etching gas at a flow rate in a range between 20 sccm and 500 sccm, a pressure in a range between 2 mTorr and 40 mTorr, and a power in a range between 100 W and 2000 W.

4. The method of claim 2, further comprising a wet etching process to remove residues and impurities generated by the dry-etching process.

5. The method of claim 1, wherein removing the first metal gate layer and the first high-K dielectric layer of the dummy gate structure in the PMOS region comprises a dry-etching process.

6. The method of claim 5, wherein the dry-etching process is characterized by a mixture gas of $Cl_2$ and $O_2$ as an etching gas, a flow rate of the $Cl_2$ gas being in a range between 50 sccm and 500 sccm, a flow rate of the $O_2$ gas being in a range between 2 sccm and 10 sccm, a pressure in a range between 2 mTorr and 40 mTorr, and a power in a range between 100 W and 2000 W.

7. The method of claim 5, wherein removing the first metal gate layer and the first high-K dielectric layer of the dummy gate structure in the PMOS region comprises a combined dry and wet etching process.

8. The method of claim 1, wherein the channel groove has a depth in a range between 1 nm and 4 nm.

9. The method of claim 1, further comprising, prior to removing the sacrificial dielectric layer and the sacrificial gate material layer:

forming sidewall structures on opposite sides of the dummy gate structures;

forming source/drain regions adjacent to the sidewall structures;

forming silicon germanium layers adjacent to the sidewall structures in the PMOS region;

forming a contact hole etch stop layer;

forming an interlayer dielectric layer completely covering the contact hole etch stop layer and the dummy gate structures; and performing a chemical mechanical polishing process to expose a top surface of the dummy gate structures.

10. The method of claim 9, further comprising, after forming the first metal gate and the second metal gate, performing a chemical mechanical polishing process to expose a top surface of the interlayer dielectric layer.

11. The method of claim 10, wherein the chemical mechanical polishing process removes the hard mask.

12. The method of claim 1, wherein the first metal gate comprises a first work function metal layer, a first barrier layer, and a first metal gate material layer disposed sequentially from bottom to top, and the second metal gate comprises a second work function metal layer, a second barrier layer, and a second metal gate material layer disposed sequentially from bottom to top.

13. The method of claim 12, wherein the first work function metal layer comprises one or more metals or metal compounds having a suitable metal material used for a NMOS device, and wherein the second work function metal layer comprises one or more metals or metal compounds having a suitable metal material used for a PMOS device.

14. The method of claim 12, further comprising a capping layer between the first high-K dielectric layer and the first work function metal layer and between the second high-K dielectric layer and the second work function metal layer, wherein the capping layer comprises titanium nitride or tantalum nitride.

15. The method of claim 1, further comprising forming an interface layer between the first high-K dielectric layer and the semiconductor substrate and between the second high-K dielectric layer and the semiconductor substrate, wherein the interface layer comprises silicon oxide.

16. The method of claim 1, wherein the first and second high-K dielectric layers each have a dielectric constant greater than 3.9; wherein the sacrificial gate material layer comprises polysilicon, silicon nitride, or amorphous carbon; wherein the sacrificial dielectric layer comprises silicon dioxide; wherein the hard mask comprises SiN or BN.

* * * * *